(12) United States Patent
Hendrix et al.

(10) Patent No.: US 7,227,478 B1
(45) Date of Patent: Jun. 5, 2007

(54) SAMPLE RATE CONVERTER WITH SELECTABLE SAMPLING RATE AND TIMING REFERENCE

(75) Inventors: Jon David Hendrix, Wimberley, TX (US); Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/302,761

(22) Filed: Dec. 14, 2005

(51) Int. Cl.
*H03M 7/00* (2006.01)

(52) U.S. Cl. .......................... 341/61; 341/143; 341/144; 375/316; 455/550.1; 455/556.1; 455/556.2

(58) Field of Classification Search .............. 341/61; 375/316; 708/313
See application file for complete search history.

(56) References Cited

U.S. PATENT DOCUMENTS

| | | | | |
|---|---|---|---|---|
| 4,460,890 A | * | 7/1984 | Busby | 341/61 |
| 5,581,579 A | * | 12/1996 | Lin et al. | 375/331 |
| 5,612,975 A | * | 3/1997 | Becker et al. | 375/319 |
| 6,462,690 B1 | * | 10/2002 | Gaboriau et al. | 341/144 |
| 6,522,275 B2 | * | 2/2003 | May | 341/143 |
| 6,539,064 B1 | * | 3/2003 | Ellis et al. | 375/296 |
| 6,650,258 B1 | * | 11/2003 | Kelly et al. | 341/61 |
| 6,717,533 B2 | * | 4/2004 | Seaberg et al. | 341/61 |
| 6,870,492 B1 | * | 3/2005 | Jensen | 341/61 |
| 2005/0070325 A1 | * | 3/2005 | Bellaouar et al. | 455/550.1 |
| 2006/0258398 A1 | * | 11/2006 | May et al. | 455/556.1 |

* cited by examiner

*Primary Examiner*—Khai M. Nguyen
(74) *Attorney, Agent, or Firm*—Garlick Harrison & Markison; Kevin L. Smith

(57) ABSTRACT

A sample rate converter includes an up-conversion module, a linear interpolator module, and a parameter control module. The up-conversion module is operable to convert a first data rate to a second data rate of a data signal. The linear interpolator module is operable to receive the data signal at the second data rate and to produce therefrom a data signal at a desired rate based on at least one parameter. The parameter control module is operable to produce the at least one parameter based on the desired rate.

21 Claims, 9 Drawing Sheets handheld audio system 10 handheld audio system 40 handheld audio system 50

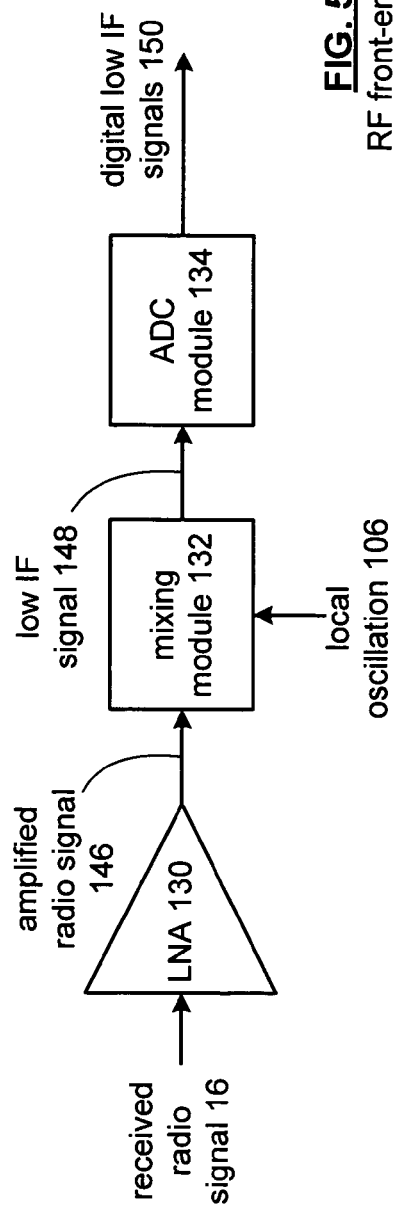
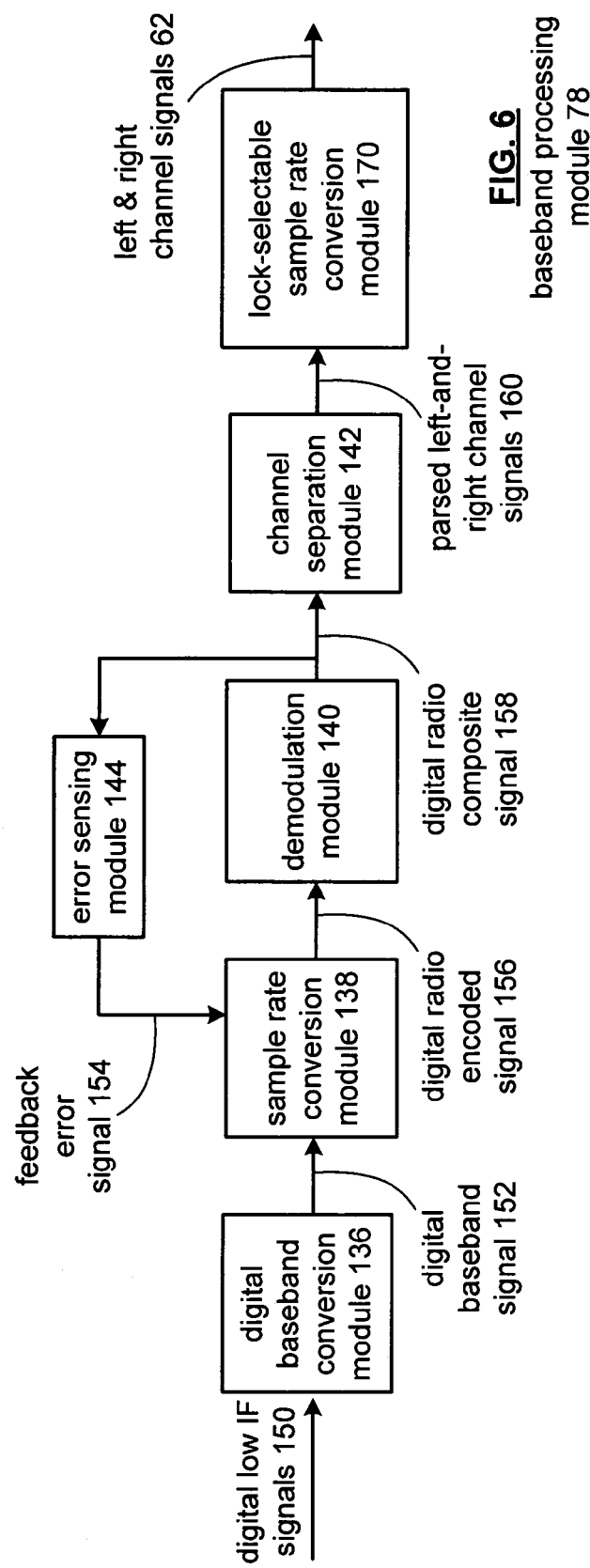

lock-selectable sample rate conversion module 170 up-conversion module 172 trend module 202

SAMPLE RATE CONVERTER WITH SELECTABLE SAMPLING RATE AND TIMING REFERENCE

This invention relates generally to portable handheld digital audio systems and more particularly to sample rate conversion for components therein.

DESCRIPTION OF RELATED ART

As is known, handheld digital audio systems are becoming very popular. Such systems include digital audio players/recorders that record and subsequently playback MP3 files, WMA files, etc. Such digital audio players/recorders may also be used as digital dictaphones and file transfer devices. Further expansion of digital audio players/recorders includes providing a frequency modulation (FM) radio receiver such that the device offers FM radio reception.

While digital audio players/recorders are increasing their feature sets, the increase in feature sets has been done in a less than optimal manner. For instance, with the inclusion of an FM receiver in a digital audio player/recorder, the FM receiver is a separate integrated circuit from the digital audio player/recorder chip set, or IC. As such, the FM receiver integrated circuit ("IC") functions completely independent of the digital audio player/recorder IC, even though both ICs include some common functionality.

Four papers teach FM receivers that address at least one of the above mentioned issues. The four papers include, "A 10.7-MHz IF-to-Baseband Sigma-Delta A/D Conversion System for AM/FM Radio Receivers" by Eric Van Der Zwan, et. al. IEEE Journal of Solid State Circuits, VOL. 35, No. 12, December 2000; "A fully Integrated High-Performance FM Stereo Decoder" by Gregory J. Manlove et. al, IEEE Journal of Solid State Circuits, VOL. 27, No. 3, March 1992; "A 5-MHz IF Digital FM Demodulator", by Jaejin Park et. al, IEEE Journal of Solid State Circuits, VOL. 34, No. 1, January 1999; and "A Discrete-Time Bluetooth Receiver in a 0.13 μm Digital CMOS Process", by K. Muhammad et. al, ISSCC2004/Session 15/Wireless Consumer ICs/15.1, 2004 IEEE International Solid-State Circuit Conference.

Typically, a sample rate converter is a component of the interface between the FM receiver and the digital audio player to accommodate for sampling rate differences that arise because of design choices and/or device architectures. While the prior art has provided sample rate converters, such converters have been used for specific device interfaces and with a dedicated timing-reference lock and sampling rate output. A need exists for a sample rate converter with interoperability flexibility for multiple devices having different sample rates, and for the capability to lock with other available timing references.

BRIEF DESCRIPTION OF THE DRAWINGS

FIG. 5 is a schematic block diagram of an radio frequency ("RF") front-end of the present invention;

FIG. 6 is a schematic block diagram of a baseband processing module of the present invention;

DETAILED DESCRIPTION

Figure 1:
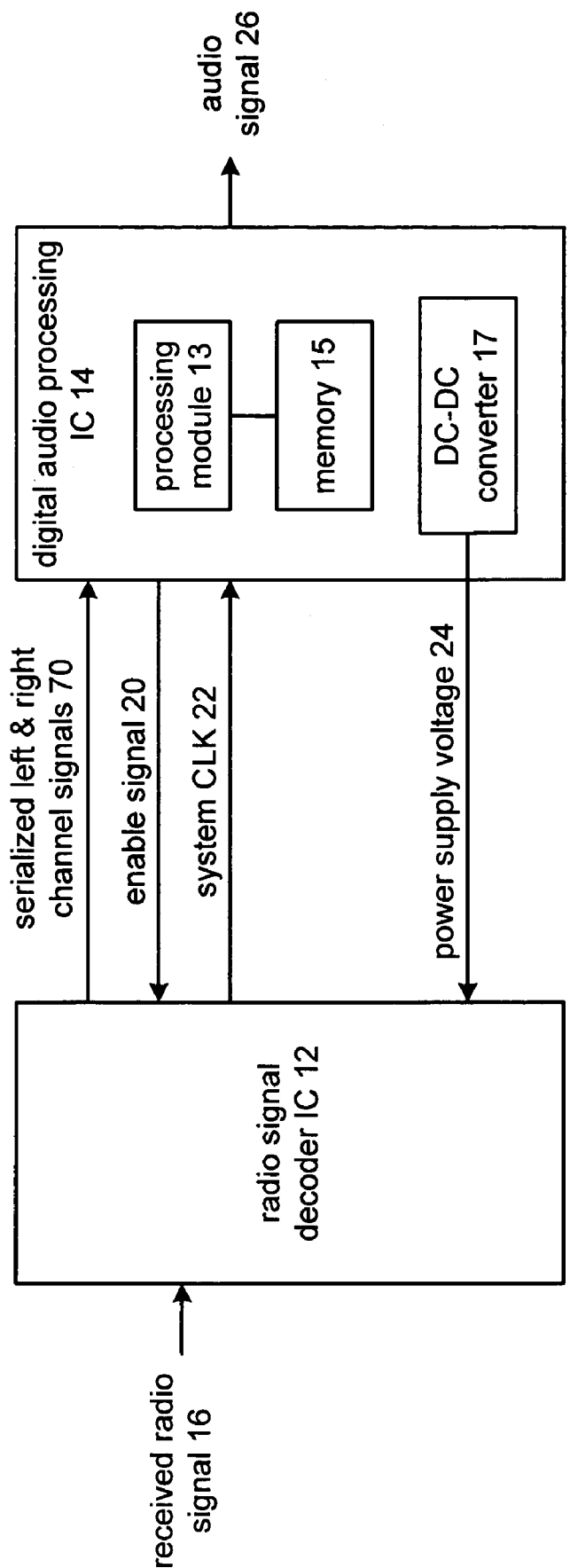
FIG. 1 is a schematic block diagram of a handheld audio system in accordance with the present invention.

FIG. 1 is a schematic block diagram of a handheld audio system 10 that includes a radio signal decoder integrated circuit (IC) 12 and a digital audio processing integrated circuit (IC) 14. The digital audio processing integrated circuit 14 includes a processing module 13, memory 15, and a DC—DC converter 17. The processing module 13 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 15 may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module 13 implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that the memory 15 stores, and the processing module 13 executes, operational instructions corresponding to at least some of the steps and/or functions illustrated in FIGS. 1 through 9.

As one of average skill in the art will appreciate, the handheld audio system of FIG. 1 may be implemented using one or more integrated circuits. For example, the radio signal decoder IC 12 may be implemented on a first integrated circuit. As an alternate example, the handheld audio system 10 may be implemented on a single integrated circuit. As yet another example, processing module 13 of the digital audio processing IC 14 and the radio signal decoder IC 12 may be a common processing device implemented on a single integrated circuit.

In operation, when a battery, or other external power source, is initially applied to the radio signal decoder IC 12, which will be described in greater detail with reference to FIGS. 3 through 12, and the digital audio processing IC 14, the DC—DC converter 17 generates a power supply voltage 24 based on an internal oscillation. When the power supply voltage 24 reaches a desired value (for example, near a regulated value), the processing module 13 provides an enable signal 20 to the radio signal decoder IC 12. In response to the enable signal 20, the radio signal decoder IC 12 generates the system clock (CLK) 22, with the remaining functionality of the radio signal decoder IC 12 being inactive awaiting a second enable signal or being activated once the system clock 22 is functioning. The radio signal decoder IC 12 provides the system clock 22 to the audio processing integrated circuit 14. Upon receiving the system clock 22, the DC—DC converter switches from an internal oscillation to the system clock 22 to produce the power supply voltage 24 from a battery voltage or an external power source.

With the system clock 22 functioning, the radio signal decoder IC 12 converts a received radio signal 16 into left-and-right channel signals 70, which may be analog or digital signals provided at a sample rate suitable for audio processing by the digital audio processing IC 14 (for example, 44.1 KHz, 48 KHz, fractions and/or multiples thereof, and/or other audio data rates). In one embodiment, the left-and-right channel signals 70 include a left-plus-right (LPR) signal and a left-minus-right (LMR) signal of a digital radio composite signal, the details of which will be discussed with reference to FIG. 3.

The digital audio processing IC 14, which may be a digital audio player/recorder integrated circuit such as the STMP35XX and/or the STMP36XX digital audio processing system integrated circuits available from Sigmatel Incorporated of Austin, Tex., receives the serialized left-and-right channel signals 70 and produces therefrom audio signals 26. The digital audio processing IC 14 may provide the audio signals 26 to a headphone set and/or other type of speaker output. As an alternative to producing the audio signals 26 from the serialized left-and-right channel signals 70, the digital audio processing integrated circuit 14 may process stored MPEG-3 Layer 3 (MP3) files, stored Windows Media Application (WMA) files, and/or other stored digital audio files to produce the audio signals 26.

Figure 2:
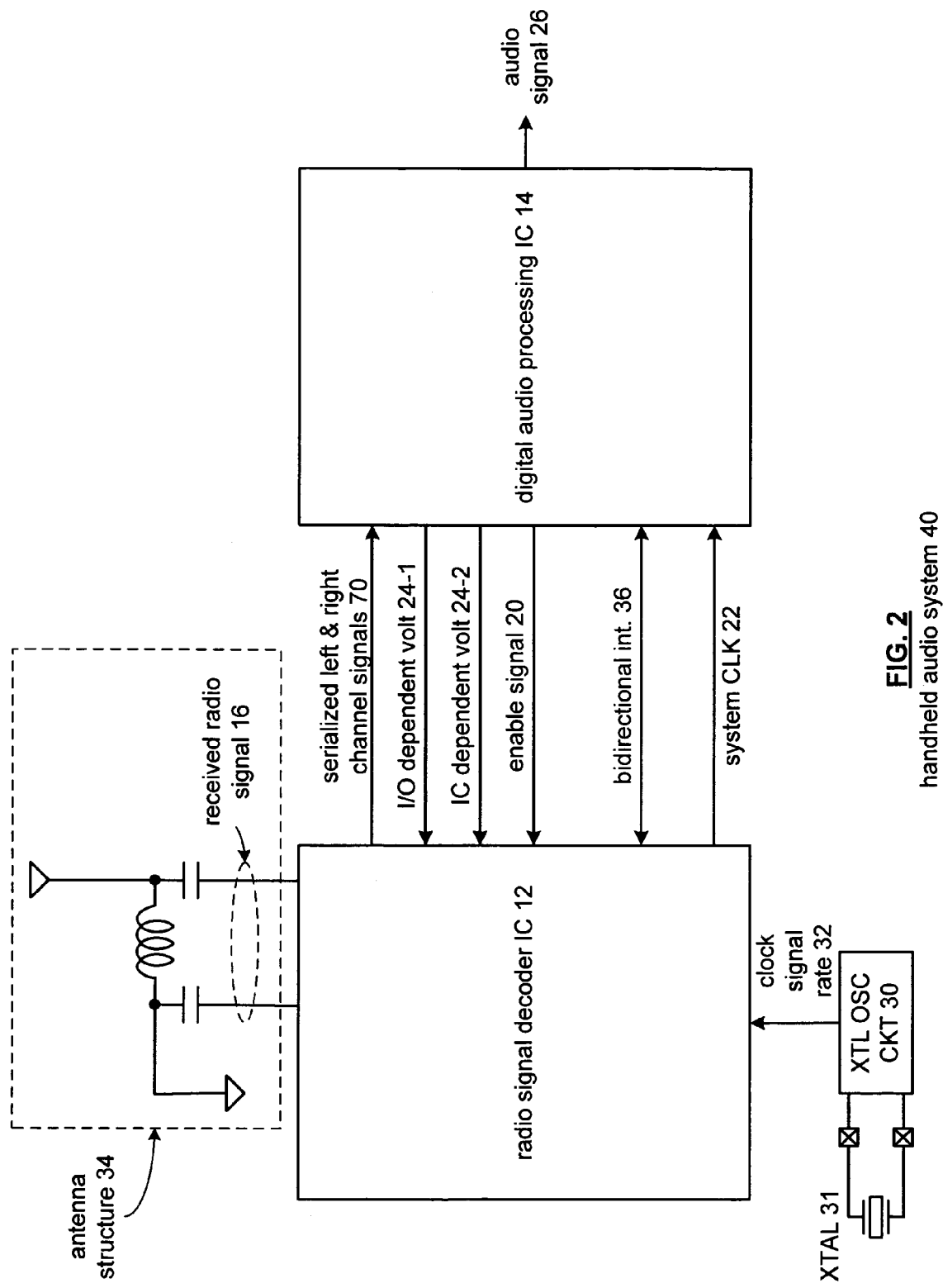
FIG. 2 is a schematic block diagram of another embodiment of a handheld audio system in accordance with the present invention.

FIG. 2 is a schematic block diagram of another handheld audio system 40 that includes the radio signal decoder IC 12 and the digital audio processing IC 14. In this embodiment, the radio signal decoder IC 12 is operably coupled to a crystal oscillator circuit 30 and an antenna structure 34. The crystal oscillator circuit 30 is operably coupled to an external crystal ("XTAL") 31 and produces therefrom a clock signal rate 32. The radio signal decoder IC 12, which may include one or more phase locked loops, converts the clock signal rate 32 into an oscillation from which the system clock (CLK) 22 is derived. For example, the system clock 22 may be the output oscillation of a phase locked loop, or an oscillation that is a multiple or fraction of the output oscillation of the phase locked loop.

The crystal oscillator circuit 30 is operably coupled, via integrated circuit pins, to an external crystal 31 to produce a clock signal rate 32. The clock signal rate 32 is based on the properties of the external crystal 31 and, as such, may range from a few kilo-hertz to hundreds of mega-Hertz. In an embodiment, the clock signal rate 32 produces the system clock 22. As one of ordinary skill in the art will appreciate, the system clock 22 may be identical to the clock signal rate 32, may have a rate that is a multiple of a clock signal rate 32, may have a rate that is a fraction of the clock signal rate 32, may have a phase shift with respect to the clock signal rate 32, or a combination thereof.

The antenna structure 34 includes an antenna, a plurality of capacitors, and an inductor coupled as shown. The received radio signal 16 is provided from the antenna structure 34 to the radio signal decoder integrated circuit 12.

As with the embodiment of FIG. 1, the radio signal decoder IC 12 converts the received radio signal 16 into left-and-right channel signals 70.

The digital audio processing integrated circuit 14, via the DC—DC converter 17, generates an input/output (I/O) dependent supply voltage 24-1 and an integrated circuit (IC) dependent voltage 24-2 that are supplied to the radio signal decoder IC 12. In one embodiment, the I/O dependent voltage 24-1 is dependent on the supply voltage required for input/output interfacing of the radio signal decoder IC and/or the digital audio processing IC 14 (for example, 3.3 volts) and the IC dependent voltage 24-2 is dependent on the IC process technology used to produce integrated circuits 12 and 14. In an embodiment, the integrated circuit process technology is 0.08 to 0.35 micron CMOS technology where the IC dependent voltage 24-2 is 1.8 volts or less.

The interface between the integrated circuits 12 and 14 further includes a bi-directional interface 36. Such an interface may be a serial interface for the integrated circuits 12 and 14 to exchange control data and/or other type of data, including the enable signal 20. In one embodiment, the bi-directional interface 36 may be one or more serial communication paths that are in accordance with the I²C serial transmission protocol. As one or ordinary skill in the art will appreciate, other serial transmission protocols may be used for the bi-directional interface 36, which may include one or more serial transmission paths.

Figure 3:
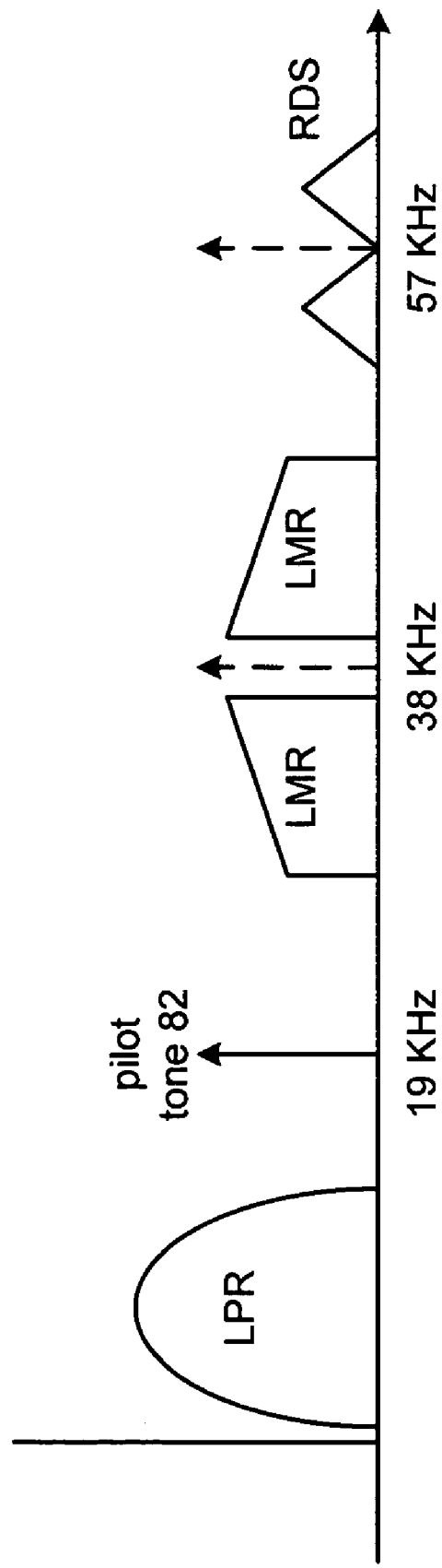
FIG. 3 is a frequency diagram of a digital radio composite signal.

FIG. 3 is a frequency diagram of the digital radio composite signal 158, which includes a pilot tone 82 at 19 kHz and another tone at 38 kHz. The signal 158 also includes a low frequency "sum" or left-plus-right (LPR) signal component, a higher frequency "difference" or left-minus-right (LMR) signal component, and a radio data system (RDS) signal component. The LPR signal component includes mono signal information, and the LMR signal component includes stereo signal information. The LMR signal component, as shown, is modulated on the 38 kHz suppressed subcarrier to produce a double sideband suppressed carrier signal (DSBCS). The RDS signal component contains small amounts of digital information, including time and radio station identification, and uses a sub-carrier tone at 57 kHz to carry data at 1187.5 bits-per-second. Note that a pilot-tone multiplex system may be used to multiplex the left and right audio signal channels in a manner compatible with mono sound, using a sum-and-difference technique to produce a "mono-compatible" composite signal.

Figure 4:
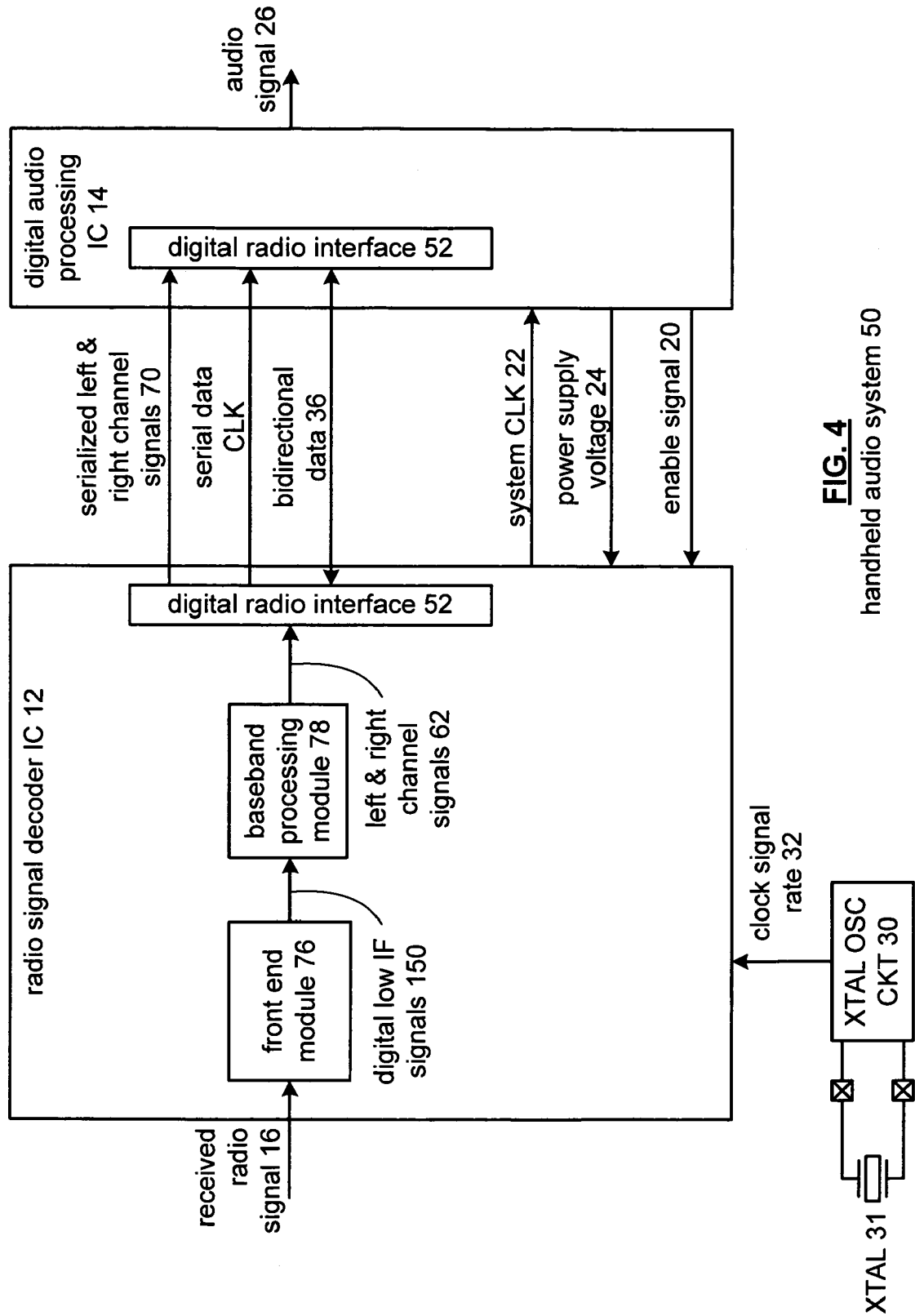
FIG. 4 is a schematic block diagram of yet another embodiment of a handheld audio system in accordance with the present invention.

FIG. 4 is a schematic block diagram of yet another embodiment of the handheld audio system 50 that includes the radio signal decoder IC 12 and the digital audio processing IC 14. In this embodiment, the radio signal decoder IC 12 includes a front-end module 76, the details of which will be discussed with reference to FIG. 5, and a baseband processing module 78, the details of which will be discussed with reference to FIG. 6. Each of the radio signal decoder IC 12 and the digital audio processing IC 14 includes a digital radio interface 52. As one of ordinary skill in the art may appreciate, the front-end module 76 contains analog circuitry to process and convert the received radio signal 16 to digital data, shown as digital low intermediate frequency (IF) signals 150. The baseband processing module 78 is operably coupled to convert the digital low IF signals 150 into digital baseband signals and to produce therefrom the digital left-and-right channel signals 62. The digital left-and-right channel signals 62 are locked to a pilot tone 82 by virtue of the signal processing for pilot-tone multiplex system signals, such as that shown in FIG. 3.

The digital radio interface 52 is operably coupled to provide the left-and-right channel signals 62 from the radio signal decoder IC 12 to the digital audio processing integrated circuit 14. Within the radio signal decoder IC 12, the digital radio interface 52 converts parallel left-and-right channel signals 62 into a serialized signal 70 and, within the digital audio processing integrated circuit 14, the digital radio interface 52 converts the serialized left-and-right channel signals 70 back into parallel signals. Note that the serial-to-parallel and parallel-to-serial functionality of the digital radio interface 52 may be programmable based on the sample rate of the radio signal decoder integrated circuit 12, a desired data rate, or other parameters of the ICs 12 and 14.

The digital radio interface 52 may convey more than the left-and-right channel signals 62, which may be in the form of left-plus-right (LPR) channel signals and left-minus-right (LMR) channel signals. For instance, the digital radio interface 52 may convey receive signal strength indications (RSSI), data clock rates, control information, functionality enable/disable signals, functionality regulation and/or control signals, and radio data service signals between the ICs 12 and 14. For a detailed discussion of the functionality of the digital radio interface 52 refer to co-pending patent applications entitled HANDHELD AUDIO SYSTEM, having a filing date of May 11, 2005, and a Ser. No. 11/126,554, which is hereby incorporated by reference.

FIG. 5 is a schematic block diagram of a radio-frequency ("RF") front-end 76 that includes a low noise amplifier (LNA) 130, a mixing module 132, and an analog-to-digital conversion module 134. In operation, the low noise amplifier 130 receives the radio signal 16 and amplifies it to produce an amplified radio signal 146. The gain at which the low noise amplifier 130 amplifies the receive signal 16 is dependent on the magnitude of the received radio signal 16 and automatic gain control (AGC) functionality of the radio signal decoder IC 12. The mixing module 132 mixes the amplified radio signal 146 with the local oscillation 106 to produce a low intermediate frequency signal 148. If the local oscillation 106 has a frequency that matches the frequency of the radio signal 146 the low intermediate frequency signal 148 will have a carrier frequency of approximately zero. If the local oscillation 106 is slightly less than the radio signal 146, then the low intermediate frequency signal 148 will have a carrier frequency based on the difference between the frequency of the radio signal 146 and the frequency of local oscillation 106. In such a situation, the carrier frequency of the low IF signal 148 may range from 0 hertz to several megahertz.

The analog-to-digital conversion module 134 converts the low IF signal 148 into a digital low IF signal 150. In one embodiment, the low IF signal 148 is a complex signal including an in-phase component and a quadrature component. Accordingly, the analog-to-digital conversion module 134 converts the in-phase and quadrature components of the low IF signal 148 into corresponding in-phase and quadrature digital signals 150.

FIG. 6 is a schematic block diagram of a baseband processing module 78 that includes a digital baseband conversion module 136, a sample rate conversion module 138, a demodulation module 140, a channel separation module 142, an error sensing module 144, and a lock-selectable sample rate conversion module 170. The digital baseband conversion module 136 is operably coupled to convert the digital low IF signals 150 into digital baseband signals 152. Note that if the digital low IF signals 150 have a carrier frequency of zero, the digital baseband conversion module 136 primarily functions as a digital filter to produce a digital baseband signal 152. If, however, the intermediate frequency is substantially non-zero, the digital baseband conversion module 136 functions to convert the digital low IF signals 150 to have a carrier frequency of approximately zero and it also performs digital filtering.

The sample rate conversion module 138 receives the digital baseband signal 152 and a feedback error signal 154 to produce a digital radio encoded signal 156. The demodulation module 140 demodulates the digital radio encoded signal 156 to produce a digital radio composite signal 158. The error sensing module 144 interprets the radio signal composite signal 158 to produce the feedback error signal 154. For a detailed discussion of the functionality of the sensing module 144, refer to co-pending patent application entitled HANDHELD AUDIO SYSTEM, having a filing date of May 11, 2005, and a Ser. No. 11/126,554. The channel separation module 142 is operably coupled to parse out signal components (such as the LPR signal, the LMR signal, the RDS, etc.) embedded in the digital radio composite signal 158 to produce the parsed digital radio composite signals 160. The lock-selectable sample rate converter ("SRC") module 170, the details of which are discussed with reference to FIGS. 7 through 12, converts the sample rate of the parsed digital radio composite signals 160 to produce left-and-right channel signals 62 at a sample rate sufficient for audio processing by the digital audio processing IC 14. The lock-selectable SRC module 170 also provides selectable conversion rates and selectable reference locks (such as to the pilot tone 82 and/or to the crystal 31).

Figure 7:
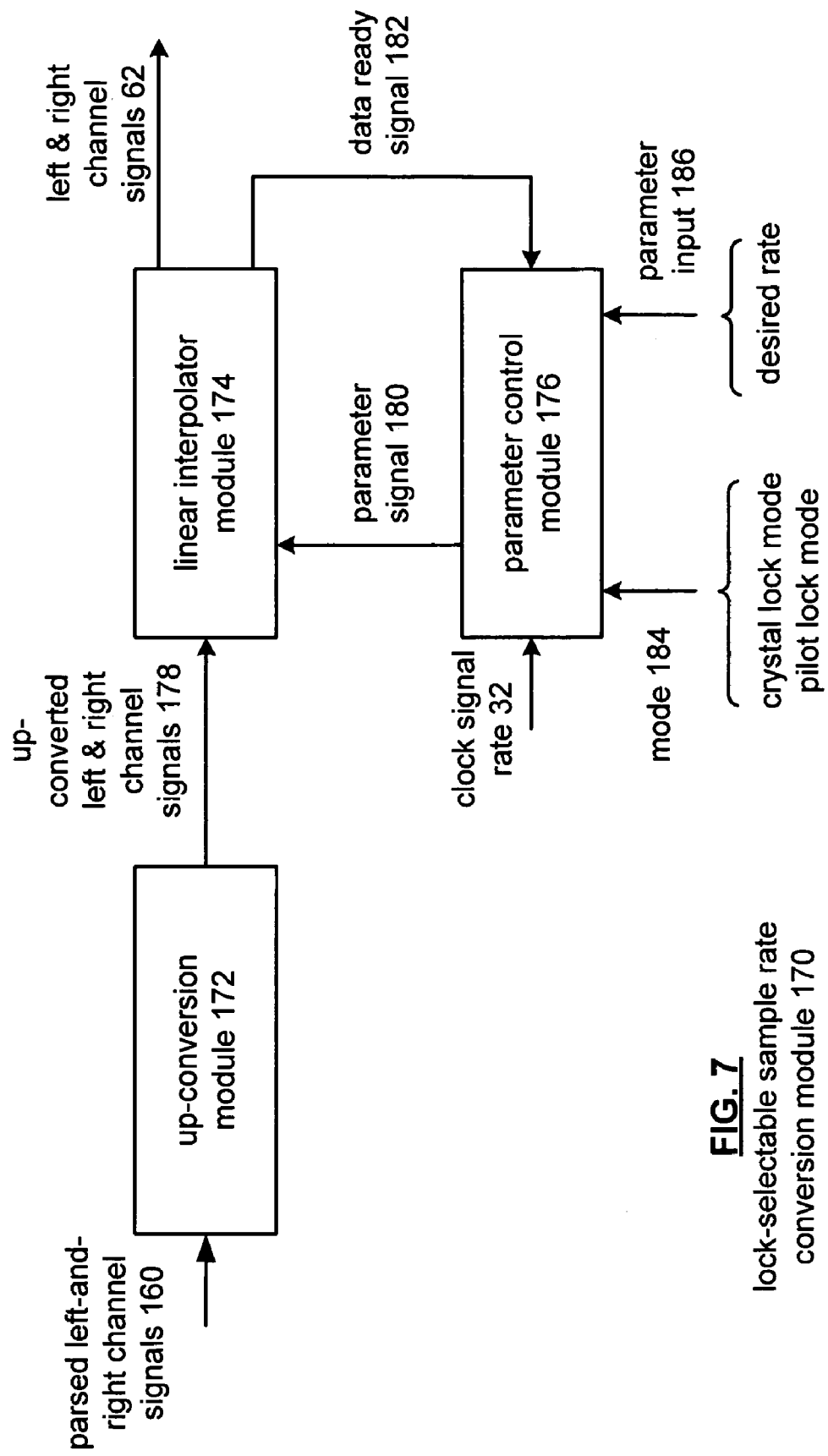
FIG. 7 is a schematic block diagram of a sample rate converter of the present invention.

FIG. 7 is a schematic block diagram of a lock-selectable SRC module 170 that includes an up-conversion module, 172, a linear interpolator module 174, and a parameter control module 176. The sample rate conversion module 170 functions to convert the data rate of the parsed left-and-right channel signals 160 to a desired rate based upon the parameter input 186, producing the left-and-right channel signals 62.

To achieve this, the up-conversion module 172, the details of which will be discussed with reference to FIG. 8, receives the parsed left-and-right channel signals 160 to convert the data rate of the parsed digital radio composite signals 160 to a sufficiently high rate to facilitate a down-conversion, within the available IC bandwidth, to achieve the desired rate output of the SRC module 170. For example, the channel separation module 142 provides the parsed left-and-right channel signals 160 at a rate of 76 kS/s to the SRC module 170. A suitable up-conversion factor is a "24-times" up-conversion. Accordingly; in this example, the sampling rate output of the up-conversion module 172, based on a 76 kS/s input, is a sampling rate of 1,824 kS/s.

The linear interpolator module 174 receives the up-converted left-and-right channel signals 178 to provide the left-and-right channel signals 62 at the desired rate, based upon the parameter input 186. The parameter control module 176, via the parameter signal 180, provides the desired rate for the left-and-right channel signals 62.

The parameter control module 176, which will be discussed in detail with reference to FIGS. 9 through 12, provides a parameter signal 180 based on a mode 184 (such as a crystal lock mode or a pilot lock mode) and the desired rate for the left-and-right channel signals 62. The crystal lock mode uses the clock signal rate 32 as the timing reference, and the pilot lock mode uses the pilot tone 82 rate as the timing reference. In one embodiment, the parameter control module 176, based on the selected mode, is either in a pass-through configuration or a closed-loop configuration.

When the selected mode is the pilot lock mode, the left-and-right channel signals 62 are locked to the pilot tone 82 as a timing reference. The parameter control module 176 receives the parameter input 186 and generates a parameter signal 180, which conveys down-sampling parameters for the linear interpolator module 174. The linear interpolator module 174 operates to generate the left-and-right channel signals 62 based on the desired rate by converting the up-converted left-and-right channel signals 178 to the left-and-right channel signals 62 having a sample rate at the desired rate locked to the radio signal pilot tone 82.

When the mode 184 is the crystal lock mode, the left-and-right channel signals 62 are locked to the timing reference provided by the clock signal rate 32. The linear interpolator module 174 outputs a desired rate provided by the parameter input 186. The parameter module 176 receives the parameter input 186 and generates a parameter signal 180 that conveys down-sampling parameters for the linear interpolator module 174 to produce the left-and-right channel signals 62 at a rate based upon the desired rate. In the crystal lock mode, the parameter control module 176 is in a closed-loop configuration to adjust the drift or deviation of the rate of the left-and-right channel signals 62, via the parameter signal 180, with respect to the clock signal rate 32. As will be explained in detail with reference to FIGS. 8 through 12, the parameter control module 176 uses the clock signal rate 32 and the data ready signal 182 to generate a trend representing the lock accuracy for the left-and-right channel signals 62 with respect to the clock signal rate 32. As the trend indicates a deviation from the clock signal rate 32, an adjustment is made to parameter signal 180.

In the present embodiment, examples of the desired sampling rates available by the lock-selectable SRC module 170 are 44.1 kS/s and/or 48.0 kS/s under either the pilot lock mode or the crystal lock mode for the left-and-right channel signals 62. It should be noted, however, that additional desired sampling rates may be provided by the lock-selectable SRC module 170 to accommodate the sampling rates formats of a variety of audio processing devices. For example, DVD-audio format devices define sampling rates including 88.2, 96, 176.4, and/or 192 kS/s. Soundcard devices define sampling rates including 44.1, 22.05, 11.025 kS/s, etc.

Figure 8:
FIG. 8 is a schematic block diagram of an up-conversion module of the present invention.

FIG. 8 is a schematic block diagram of an up-conversion module 172 that includes an up-conversion with Finite Impulse Response (FIR) filter module 188, and an up-sampling Cascaded Integrator-Comb (CIC) filter module 190. In operation, the up-conversion module 172 converts the left-and-right channel signals 62 at a first sample rate to up-converted left-and-right channel signals 178, which is a sample rate that sufficiently exceed the available desired sample rate output of the left-and-right channel signals 62. To achieve this, the FIR filter module 188 receives the parsed digital radio composite signals 160, and up-samples and filters the signals 160 to provide a digital output at a filtered sampling rate. A suitable up-conversion rate associated with the FIR filter module 188 is a "2-times" up-conversion to double the sample rate of the parsed digital radio composite signals 160. The finite impulse response component of the filter module 188 operates as a low pass filter to filter the noise introduced by the up-conversion.

The up-sampling cascaded integrator-comb filter module 190 receives the output of the up-conversion with FIR filter module 188, and increases the up-sample rate (for example, by a factor of 12) to produce up-converted left-and-right channel signals 178. Under the example provided, the cumulative rate increase is "24." Accordingly, when the sample rate of the parsed digital radio composite signals 160 is at 76 kS/s, the rate, output from the up-conversion module 172 is 1,824 kS/s. For a more detailed discussion of FIR filters and CIC filters, refer to the teachings of U.S. Pat. No. 5,566,101, issued Oct. 15, 1996, titled METHOD AND APPARATUS FOR A FINITE IMPULSE RESPONSE FILTER PROCESSOR, and U.S. Pat. No. 6,584,162, issued Jun. 24, 2003, titled METHOD AND APPARATUS SAMPLE RATE CONVERSIONS IN AN ANALOG TO DIGITAL CONVERTER, both of which is hereby incorporated by reference.

Figure 9:
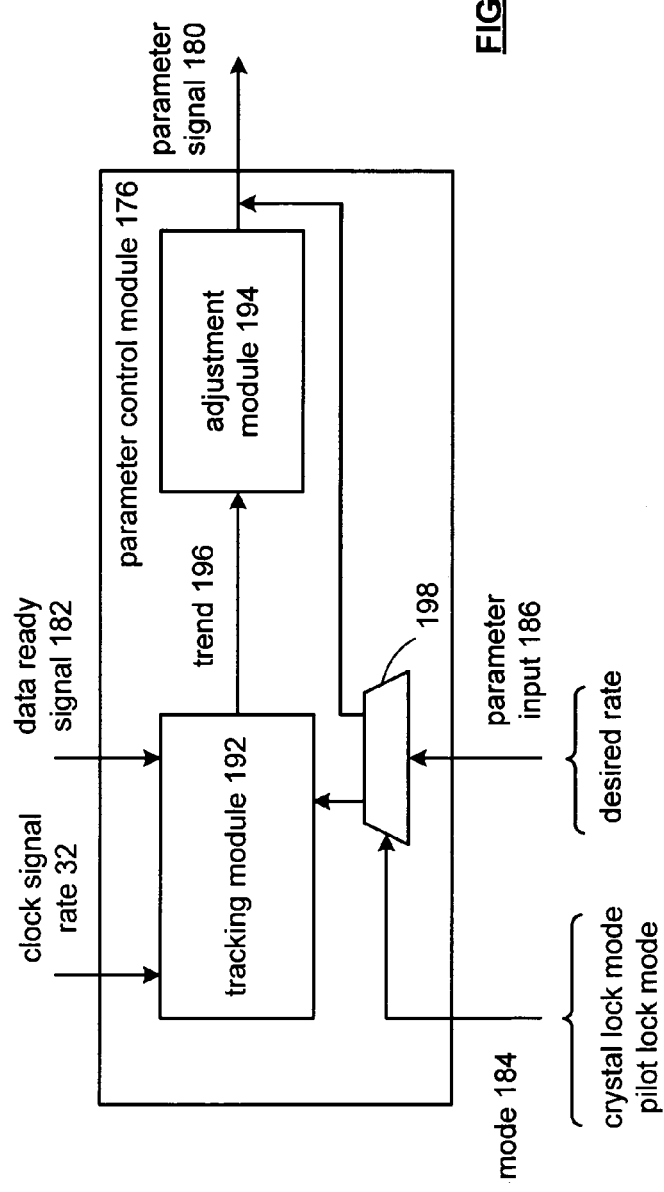
FIG. 9 is a schematic block diagram of a parameter control module of the present invention.

FIG. 9 is a schematic block diagram of a parameter control module 176 that includes a tracking module 192, an adjustment module 194, and a multiplexer module 198. In operation, the parameter control module 176 produces the parameter signal 180 based on the desired rate provided through the parameter input 186, the clock signal rate 32, the mode 184, and a data ready signal 182. In one embodiment, the mode 184 indicates whether the lock-selectable SRC module 170 is in a crystal lock mode or a pilot lock mode. When in the pilot lock mode, parameter control module 176 is in a pass-through configuration. The multiplexer module 198 passes the desired rate from the parameter input 186 to the parameter signal 180. That is, as one of ordinary skill in the art may appreciate, the 19 KHz pilot tone 82 of transmitted FM signals have timing and/or lock properties. Under a pilot lock mode, the corresponding properties of the actual pilot tone 82 embedded within the digital composite radio signal 158 permit the parameter control module 176 to lock the lock-selectable SRC module 170 to the rate of the pilot tone 82. This is, the sample rate conversion module 138 utilizes the error signal 154 to lock the sample rate of digital radio encoded signal 156 to the pilot tone 82. Because digital radio encoded signal 156 is locked to the pilot, it follows that the parsed left-and-right channel signals 160 are also locked to the pilot. Therefore, under pilot lock mode, the SRC module 170 changes the sample rate in a generally synchronous manner according to the parameter input 186, which is passed-through to the parameter signal 180.

When in the crystal lock mode, the parameter control module 110 is in a closed-loop configuration to provide adjustment for drift or deviation of the rate of the left-and-right channel signals 62 (see FIG. 7) through the down-conversion parameter value provided by parameter signal 180. In this mode, the parameter control module 176 produces the parameter signal 180 based on the relationship of the clock signal rate 32 and the data ready signal 182. The relationship between the clock signal rate 32 and the data ready signal 182 are tracked by the tracking module 192, the details of which will be discussed with reference to FIGS. 10 and 11.

In operation, the tracking module 192 tracks the relationship of the data ready signal 182 with respect to the clock signal rate 32. The data ready signal 182 represents the generation of the each sample of the left-and-right channel signals 62. When in the crystal lock mode, the data ready signal 182 is anticipated to "strobe" or trigger upon a predetermined number of clock periods. The data ready signal 182, however, may strobe earlier or later than the predetermined number of clock periods. Accordingly, the tracking module 192 produces a trend 196 to indicate the relationship of the lock of the data ready signal 182—and correspondingly, the desired rate of the left-and-right channel signals 62—to the clock signal rate 32 over a period of time. The trend 196 may be a neutral trend, a positive trend, or a negative trend. When the trend 196 is a neutral trend, the data ready signal 182, on average, strobes when expected, and that a sufficient lock to the clock signal rate 32 exists. When the trend 196 is a positive trend or a negative trend, the data ready signal 182 strobes arrive out-of-sequence, and the left-and-right channel signals 62 are deviating from a crystal lock with the clock signal rate 32. A negative trend indicates that the data ready signal strobes are occurring earlier than anticipated to establish a crystal lock. The positive trend indicates that the data ready signal strobes are occurring later than anticipated to establish a crystal lock.

When the trend 196 goes negative or positive, the adjustment module 194 adjusts the desired rate parameter, from the parameter input 186, towards a neutral output for the trend 196. In general, the parameter signal 180, based on the desired rate provided by the parameter input 186, may have an integer portion and a fractional portion having a variable numerator, which for use with a modulo-256 counter, may be expressed as:

$$\text{parameter} = \left\{ I, \frac{F}{256} \right\}$$

where "I" represents the integer portion and F represents the fractional portion. The fractional portion F serves as the variable numerator generated by the adjustment module 194.

To calculate the variable down-conversion parameter provided by the parameter signal 116 to the linear interpolation module 174, the rate of the up-converted left-and-right channel signals 178 is divided by the desired rate. Accordingly, for a desired rate of 44.1 kS/s output by the lock-selectable SRC module 170, the down-conversion rate for the linear interpolator module 174 is 1,824 kS/s divided by 44.1 kS/s, which equals "41.3605." The parameter integer portion I is "41." The parameter fractional portion F, when the granularity or coarseness between samples for the linear interpolator module is "256" or "$2^8$" for a modulo-256 counter within the linear interpolator module 174, is "0.3605" times "256", which equals "92.288". The parameter signal 180 provides the "41.1" as the integer portion and "92.288" as the variable fractional portion F for a desired rate of 44.1 kS/s. As a further example for a desired rate of 48.0 kS/s, the down conversion rate is the rate of the signals 178 (that is 1,824 kS/s) divided by 48.0 kS/s, which equals "38.0." The integer portion I is "38." The fractional portion, when the granularity or coarseness between samples is "256" or "$2^8$" for a modulo-256 counter within the linear interpolator module is "0" times "256", which is "0". Accordingly, the parameter signal 180 provides the "38" as the integer portion I and "0" as the variable fractional portion F for a desired rate of 48.0 kS/s. With respect to the examples above pertaining to the desired rates of 44.1 kS/s and/or 48.0 kS/s, which is summarized in Table 1.

TABLE 1

| | Parameter Signal 116 | |
| --- | --- | --- |
| Desired Rate | Integer Portion (I) | Fractional Portion (F) (for modulo-256) |
| 44.1 kS/s | 41 | 92.288 |
| 48.0 kS/s | 38 | 0 |

These parameters are generated and/or provided under the pilot lock mode and the crystal lock mode of the mode 184. The distinction is that when in the crystal lock mode, a closed loop configuration of the lock-selectable SRC module 170 provides that the adjustment module 194 adjusts the fractional portion F of the parameter to compensate for deviation from the timing reference provided by the clock signal rate 32.

Figure 10:
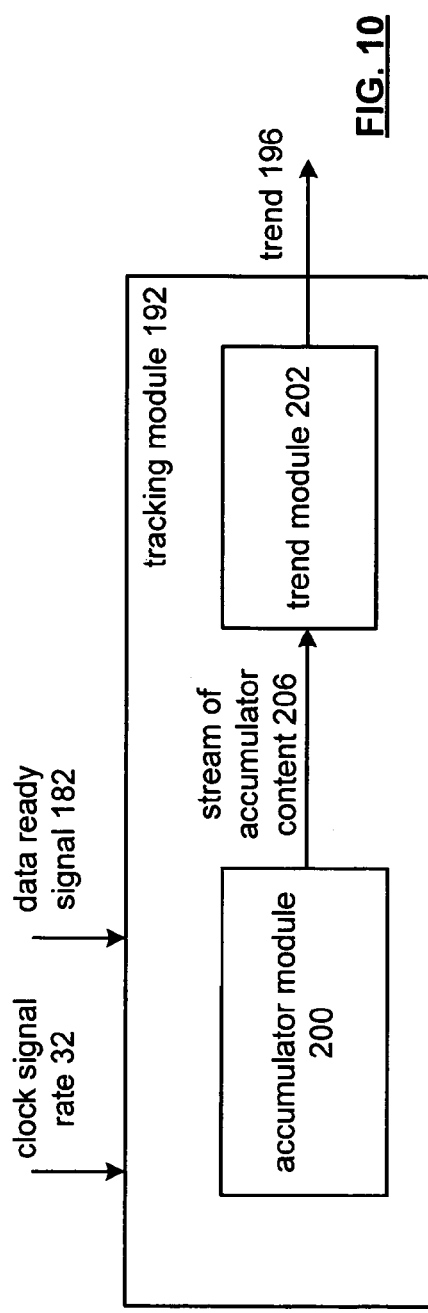
FIG. 10 is a schematic block diagram of a tracking module of the present invention.

FIG. 10 is a schematic block diagram illustrating further details of the tracking module 192 that includes an accumulator module 200 and a trend module 202. The details of the trend module 202 are discussed in detail with respect to FIG. 11. In a crystal lock mode of operation, the accumulator module 200 generates a trend 196 of the sample rate provided by the output of the linear interpolator module 174 with respect to the clock signal rate 32. To achieve this, the accumulator module 200 accumulates or logs the cycles of the clock signal rate 32 on an edge of the clock cycles (such as the positive or rising edges) to produce a stream of accumulator content 206 to the trend module 202. Upon the output of the sample rate output by the linear interpolator module 174 for the left and right channel signals 62, the data ready signal 182 issues a strobe or trigger indication. When the data ready signal 182 strobes, the accumulator module 200 is decremented by a predetermined amount. Because the data ready signal 182 is initially configured to "strobe" or trigger upon a predetermined number of clock periods, the resulting trend over time is ideally a neutral trend, which indicates that the output of the SRC module 170 is locked with the clock signal rate 32. The data ready signal 182, however, may strobe earlier or later than the predetermined number of clock periods, producing a negative trend or a positive trend, respectively, that is reflected in the stream of accumulator content 206 provided to the trend module 202. The trend module 202 senses or determines the trend 196 indicating the trend of the data ready signal 182 with respect to the clock signal rate 32 is a negative ("−1") trend, a neutral ("0") trend, or a positive ("+1") trend.

Figure 11:
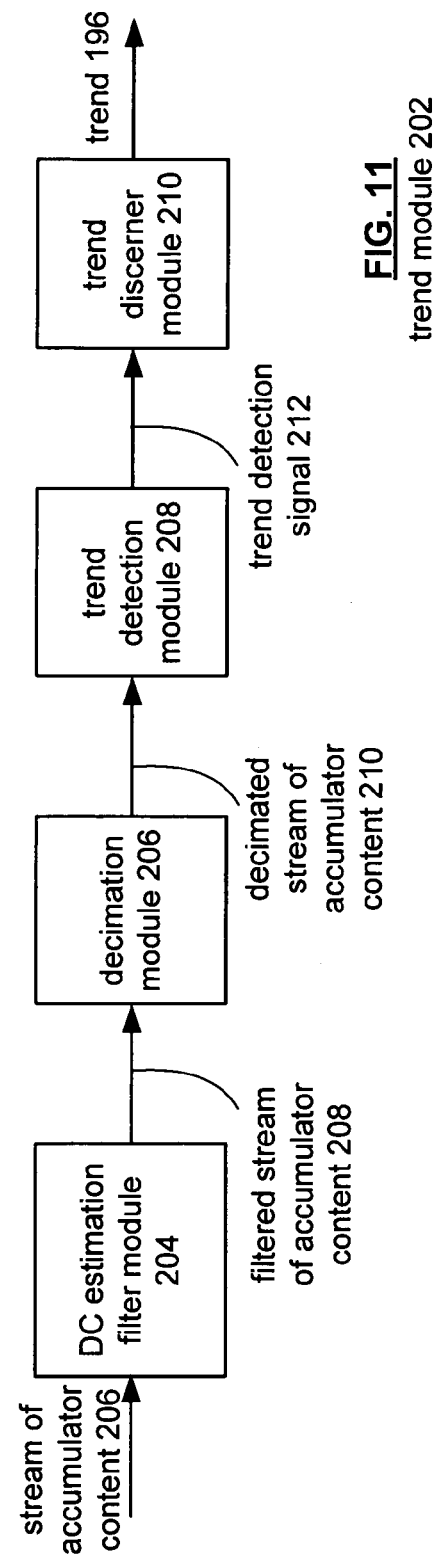
FIG. 11 is a schematic block diagram of the trend module of the present invention.

FIG. 11 is a schematic block diagram of the trend module 202 that includes a DC estimation filter module 204, a decimation module 206, a trend detection module 208, and a trend discerner module 210. The DC estimation filter module 204 receives the stream of accumulator content 206, and provides a filtered stream of accumulator content 208. The DC estimation filter module 204, which filters high frequency noise while remaining stable around the DC point, may be provided as a leaky integrator, a leaky bucket integrator, etc. The decimation module 206 decimates the filtered stream of accumulator content 208 to a decimated stream of accumulator content 210, which provides a granularity-based sample window for accumulator data that is considered for trend development. A lower granularity sample window is desired for generating a longer-view that represents a general trend or nature of the lock of the SRC module 170 with respect to the clock signal rate 32. The trend detection module 208 compares the values of the decimated stream of accumulator content 210, providing a trend detection signal 212. The trend discerner module 210 quantifies the trend detection signal 212 to produce the trend 196, which may be designated as a positive trend, a negative trend, or a neutral trend. With the trend 196, the fractional portion F of the parameter signal 180 is adjusted, as appropriate, to bring the trend towards a neutral trend.

Figure 12:
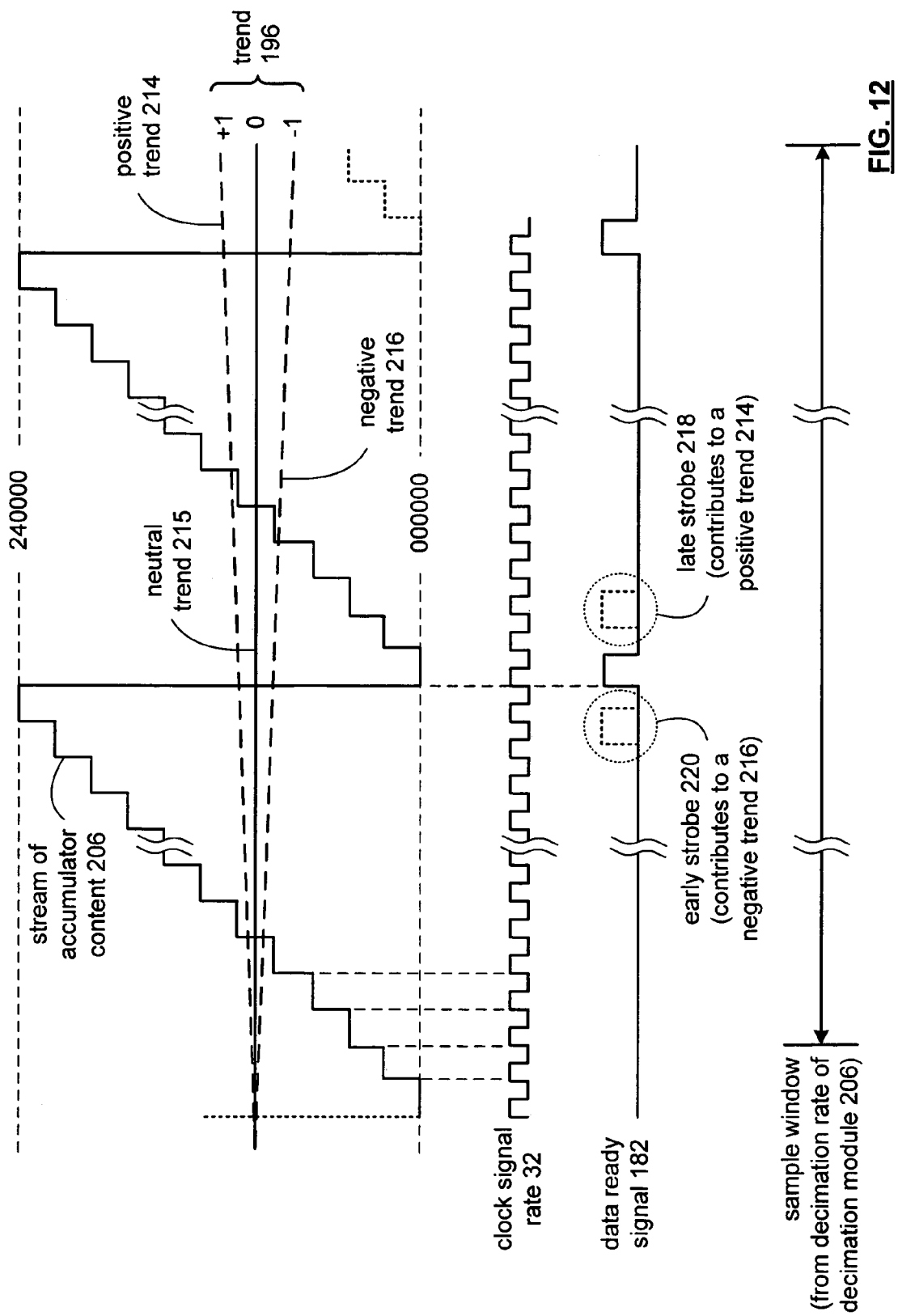
FIG. 12 is a timing diagram illustrating the operation of the tracking module of FIG. 10.

FIG. 12 is a timing diagram illustrating the functionality of the tracking module 192 shown in FIG. 10. Illustrated is the stream of accumulator content 206, the cycles of the clock signal rate 32, and the data ready signal 182. Accordingly, as the clock signal rate cycles, the accumulator counts the cycles of the clock signal rate 32, and is decremented based upon the data ready signal 182. When the data ready signal 182 strobes, which in the present example is indicated at the positive edge of the data ready signal 182, the accumulator module 200 content is decremented by a constant neutral value selected to represent that the desired rate is locked with the clock signal rate 32. For the present example, the data ready signal has a rate of 44.1 kHz rate with respect to a 24 MHz clock rate for sustaining a neutral trend.

The process of incrementing and decrementing the contents of the accumulator module 200, over time, generate a trend 196 that may be a positive trend 214, a neutral trend 215, and/or a negative trend 216 based on the correspondence of the data ready signal 182 with the clock signal rate 32. The positive trend 133 or the negative trend 135 occur when the data ready signal 182 strobes later or earlier than the predetermined number of clock periods, indicating a drift or deviation of the output of the lock-selectable SRC module 170 with respect to the clock signal rate 32. In the crystal lock mode, when the left-and-right channel signals 62 are locked with the clock signal rate 32, the trend 196 is a neutral trend 215. The time window over which the trend 196 is generated can be extended to slow the trend 196 reaction to transitions between a positive trend 214 and a negative trend 216. The decimation module 206, through the decimation rate, provides the time window (or granularity level) of the stream of accumulator content 206, in which a longer time window for the stream of accumulator content 206 is accomplished by increasing the decimation rate.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (that is, where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a handheld device that incorporates a radio signal decoder integrated circuit with a sample rate converter having selectable sampling rate and timing reference capability. As one of average skill in the art will appreciate, other embodiments may be derived from the teaching of the present invention without deviating from the scope of the claims.

What is claimed is:

1. A sample rate converter comprises:
   an up-conversion module operably coupled to convert a first data rate to a second data rate of a data signal;
   a linear interpolator module operably coupled to receive the data signal at the second data rate and to produce therefrom the data signal at a desired rate based on at least one parameter; and
   a parameter control module operably coupled to produce the at least one parameter based on the desired rate and a mode including at least one of a crystal lock mode and a pilot lock mode, the parameter control module including:
      a tracking module operably coupled to, when enabled in the crystal lock mode produce a trend of the desired rate with respect to a clock signal rate; and
      an adjustment module operably coupled to adust the at least one parameter based on the trend.

2. The sample rate converter of claim 1 wherein the tracking module further comprises:
   an accumulator module operably coupled to, when the tracking module is enabled in the crystal lock mode, generate a stream of accumulator content that is incremented based upon the clock signal rate and that is decremented upon each sample of the data signal at the desired rate; and
   a trend module to produce the trend based on the stream of accumulator content.

3. The sample rate converter of claim 2 wherein the adjustment module further comprises:
   a DC estimation filter module operably coupled to filter the stream of accumulator content;
   a decimation module operably coupled to decimate the filtered stream of accumulator content to generate a decimated stream of accumulator content;
   a trend detection module operably coupled to compare samples of the decimated stream of accumulator content and generate therefrom a trend detection signal; and
   a trend discerner module to generate the trend.

4. The sample rate converter of Claim 1 wherein the at least one parameter comprises a fractional value.

5. The sample rate converter of claim 4 wherein each sample of the data signal at the desired rate comprises a data ready signal.

6. The sample rate converter of claim 1 wherein the up-conversion module further comprises:
   an up-conversion with a Finite Impulse Response (FIR) filter module; and
   an up-sampling Cascaded Integrator-Comb (CIC) filter module.

7. A handheld audio system comprises:
   a radio signal decoding module operably coupled to produce digital audio data from a selected continuous-time radio signal; and
   a digital audio processing module operably coupled to produce audio signals for audio playback from the digital audio data,
   wherein the radio signal decoding module includes a sample rate converter operably coupled to the digital audio processing integrated circuit, wherein the sample rate converter provides the digital audio data at a desired rate, wherein the sample rate converter includes:
      an up-conversion module operably coupled to convert a first data rate to a second data rate of the digital audio data;
      a linear interpolator module operably coupled to receive the digital audio data and to produce therefrom the digital audio data at the desired rate based on at least one parameter; and a parameter control module operably coupled to produce the at least one parameter based on the desired rate.

8. The handheld audio system of claim 7 wherein the at least one parameter is further based on a mode.

9. The handheld audio system of claim 8 wherein the mode comprises at least one of:
   a crystal lock mode; and
   a pilot lock mode.

10. The handheld audio system of claim 9 wherein the parameter control module further comprises:
    a tracking module operably coupled to, when enabled in the crystal lock mode, produce a trend of the desired rate with respect to a clock signal rate; and
    an adjustment module operably coupled to adjust the at least one parameter based on the trend.

11. The handheld audio system of claim 10 wherein the tracking module further comprises:
    an accumulator module operably coupled to, when the tracking module is enabled in the crystal lock mode, generate a stream of accumulator content that is incremented based upon the clock signal rate and that is decremented upon each sample of the digital audio data at the desired rate; and
    a trend module to produce the trend based on the stream of accumulator content.

12. The handheld audio system of claim 11 wherein the adjustment module further comprises:
    a DC estimation filter module operably coupled to filter the stream of accumulator content;
    a decimation module operably coupled to decimate the filtered stream of accumulator content to generate a decimated stream of accumulator content;
    a trend detection module operably coupled to compare samples of the decimated stream of accumulator content and generate therefrom a trend detection signal; and
    a trend discerner module to generate the trend.

13. The handheld audio system of claim 7 wherein the at least one parameter comprises a fractional value.

14. The handheld audio system of claim 7 wherein the up-conversion module further comprises:
    an up-conversion with a Finite Impulse Response (FIR) filter module; and
    an up-sampling Cascaded Integrator-Comb (CIC) filter module.

15. A radio signal decoder integrated circuit comprises:
    a radio signal decoder module operably coupled to, when enabled, convert a selected continuous-time radio signal into digital audio data in accordance with a local oscillation; and
    a crystal oscillator circuit operably coupled to the radio signal decoder integrated circuit, wherein the radio signal decoder integrated circuit produces a system clock from a reference oscillation produced by the crystal oscillator circuit,
    wherein the radio signal decoder integrated circuit includes a sample rate converter operably coupled to the digital audio processing integrated circuit, wherein the sample rate converter provides the digital audio data at a desired rate, wherein the sample rate converter includes:
    an up-conversion module operably coupled to convert a first data rate to a second data rate of the digital audio data;
    a linear interpolator module operably coupled to receive the digital audio data at the second data rate and to produce therefrom the digital audio data at the desired rate based on at least one parameter; and
    a parameter control module operably coupled to produce the at least one parameter based on the desired rate.

16. The radio signal decoder integrated circuit of claim 15 wherein the at least one parameter is further based on a mode.

17. The radio signal decoder integrated circuit of claim 16 wherein the mode comprises at least one of:
    a crystal lock mode; and
    a pilot lock mode.

18. The radio signal decoder integrated circuit of claim 15 wherein the parameter control module further comprises:
    a tracking module operably coupled to, when enabled in the crystal lock mode, produce a trend of the desired rate with respect to the reference oscillation; and
    an adjustment module operably coupled to adjust the at least one parameter based on the trend.

19. The radio signal decoder integrated circuit of claim 18 wherein the tracking module further comprises:
    an accumulator module operably coupled to, when the tracking module is enabled in the crystal lock mode, generate a stream of accumulator content that is incremented based upon the clock signal rate and that is decremented upon each sample of the digital audio data at the desired rate; and
    a trend module to produce a trend based on the stream of accumulator content.

20. The radio signal decoder integrated circuit of claim 19 wherein the adjustment module further comprises:
    a DC estimation filter module operably coupled to filter the stream of accumulator content;
    a decimation module operably coupled to decimate the filtered stream of accumulator content to generate a decimated stream of accumulator content;
    a trend detection module operably coupled to compare samples of the decimated stream of accumulator content and generate therefrom a trend detection signal; and
    a trend discerner module to generate the trend.

21. The radio signal decoder integrated circuit of claim 15 wherein the up-conversion module further comprises:
    an up-conversion with a Finite Impulse Response (FIR) filter module; and
    an up-sampling Cascaded Integrator-Comb (CIC) filter module.

* * * * *